(12) United States Patent
Tomikawa et al.

(10) Patent No.: US 10,813,220 B2
(45) Date of Patent: Oct. 20, 2020

(54) ELECTRONIC COMPONENT EMBEDDED SUBSTRATE

(71) Applicant: TDK CORPORATION, Tokyo (JP)

(72) Inventors: Mitsuhiro Tomikawa, Tokyo (JP); Koichi Tsunoda, Tokyo (JP); Kazuhiro Yoshikawa, Tokyo (JP); Kenichi Yoshida, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/892,722

(22) Filed: Feb. 9, 2018

(65) Prior Publication Data

US 2018/0235086 A1 Aug. 16, 2018

(30) Foreign Application Priority Data

Feb. 13, 2017 (JP) ................. 2017-024159

(51) Int. Cl.
*H05K 1/18* (2006.01)
*H05K 3/30* (2006.01)
*H05K 3/38* (2006.01)
*H05K 3/46* (2006.01)
*H05K 3/00* (2006.01)

(52) U.S. Cl.
CPC ............ *H05K 1/186* (2013.01); *H05K 1/185* (2013.01); *H05K 3/30* (2013.01); *H05K 3/38* (2013.01); *H05K 3/4697* (2013.01); *H05K 3/007* (2013.01); *H05K 3/0032* (2013.01); *H05K 3/4644* (2013.01); *H05K 2201/10015* (2013.01); *H05K 2201/10984* (2013.01); *H05K 2203/107* (2013.01); *H05K 2203/1461* (2013.01)

(58) Field of Classification Search
CPC .......... H05K 1/186; H05K 3/38; H05K 3/007; H05K 3/30; H05K 3/0032; H05K 2201/10984; H05K 2201/107; H05K 2201/10015
See application file for complete search history.

(56) References Cited

U.S. PATENT DOCUMENTS 5,633,181 A 5/1997 Hayashi
5,822,175 A 10/1998 Azuma
(Continued)

FOREIGN PATENT DOCUMENTS

JP H08-097310 A 4/1996
JP H10-093041 A 4/1998
(Continued)

*Primary Examiner* — Paresh H Paghadal
(74) *Attorney, Agent, or Firm* — Oliff PLC (57) ABSTRACT

An electronic component embedded substrate includes: a substrate that includes an insulating layer and has a first principal surface and a second principal surface; an electronic component that is embedded in the substrate and has at least one first terminal, at least one second terminal, and a capacity part; at least one via conductor that are formed in the insulating layer and electrically connected to the second terminal; and an adhesion layer that is in contact with the second terminal on an end face of the second terminal which are close to the second principal surface. The electronic component is laminated with the insulating layer, and adhesion strength between the adhesion layer and the insulating layer is higher than that between the second terminal and the insulating layer.

4 Claims, 6 Drawing Sheets

(56) References Cited

U.S. PATENT DOCUMENTS

| | | | |
|---|---|---|---|
| 5,929,473 A | 7/1999 | Nishihori et al. | |
| 6,027,947 A | 2/2000 | Evans et al. | |
| 6,225,185 B1 | 5/2001 | Yamazaki et al. | |
| 9,462,697 B2* | 10/2016 | Chung | H05K 1/186 |
| 9,837,343 B2* | 12/2017 | Kim | H01L 23/49827 |
| 2002/0102768 A1 | 8/2002 | Shioga et al. | |
| 2002/0122287 A1 | 9/2002 | Mido | |
| 2004/0018693 A1 | 1/2004 | Shioga et al. | |
| 2004/0130849 A1* | 7/2004 | Kurihara | H01G 4/228 |
| | | | 361/311 |
| 2005/0146838 A1 | 7/2005 | Shioga et al. | |
| 2005/0156279 A1 | 7/2005 | Shioga et al. | |
| 2006/0245139 A1 | 11/2006 | Kariya | |
| 2006/0250749 A1 | 11/2006 | Kurihara et al. | |
| 2007/0034989 A1 | 2/2007 | Shioga et al. | |
| 2007/0139859 A1 | 6/2007 | Osaka et al. | |
| 2007/0141800 A1 | 6/2007 | Kurihara et al. | |
| 2008/0068780 A1 | 3/2008 | Shioga et al. | |
| 2008/0145996 A1 | 6/2008 | Nomura et al. | |
| 2008/0164563 A1 | 7/2008 | Nomura et al. | |
| 2008/0315358 A1 | 12/2008 | Shioga et al. | |
| 2009/0007405 A1 | 1/2009 | Shioga et al. | |
| 2009/0201624 A1 | 8/2009 | Hattori et al. | |
| 2009/0205859 A1* | 8/2009 | Tanaka | H01L 24/82 |
| | | | 174/260 |
| 2009/0244865 A1* | 10/2009 | Tanaka | H01L 23/5389 |
| | | | 361/764 |
| 2010/0118468 A1 | 5/2010 | Nomura et al. | |
| 2010/0246089 A1 | 9/2010 | Yano et al. | |
| 2010/0300737 A1* | 12/2010 | Sato | H01L 23/5389 |
| | | | 174/260 |
| 2011/0044011 A1 | 2/2011 | Ohtsuka et al. | |
| 2011/0075319 A1 | 3/2011 | Oikawa et al. | |
| 2011/0110016 A1 | 5/2011 | Takeshima et al. | |
| 2011/0128669 A1 | 6/2011 | Yano et al. | |
| 2011/0240354 A1* | 10/2011 | Furuhata | H01L 21/568 |
| | | | 174/258 |
| 2012/0104545 A1 | 5/2012 | Takeshima et al. | |
| 2015/0096789 A1* | 4/2015 | Kim, II | H05K 1/185 |
| | | | 174/251 |
| 2016/0027579 A1 | 1/2016 | Kurachi et al. | |
| 2016/0064473 A1 | 3/2016 | Morito et al. | |

FOREIGN PATENT DOCUMENTS

| | | |
|---|---|---|
| JP | 2002-222925 A | 8/2002 |
| JP | 2004-214589 A | 7/2004 |
| JP | 2007-081325 A | 3/2007 |
| JP | 2008-277520 A | 11/2008 |
| JP | 2009-194096 A | 8/2009 |
| JP | 2010-225849 A | 10/2010 |
| JP | 2011-040571 A | 2/2011 |
| JP | 2011-077343 A | 4/2011 |
| JP | 2014-090077 A | 5/2014 |
| JP | 2016-167619 A | 9/2016 |

* cited by examiner

ELECTRONIC COMPONENT EMBEDDED SUBSTRATE

TECHNICAL FIELD

The present invention relates to an electronic component embedded substrate.

BACKGROUND

An electronic component embedded substrate with a thin film capacitor having a lower electrode, a dielectric thin film, and an upper electrode that faces the lower electrode across the dielectric thin film is described in Japanese Unexamined Patent Publication No. 2007-81325.

Meanwhile, in the electronic component embedded substrate in which the electronic component (the thin film capacitor) as described above is embedded, the second terminal (the lower electrode) of the electronic component is electrically connected to an external component or the like by way of, for instance, a via conductor. However, adherability between the second terminal of the electronic component and the via conductor may be insufficient. In this case, a connection structure for the second terminal and the via conductor may be damaged by internal stress in the electronic component embedded substrate and an external force. Therefore, an improvement in reliability of electrical connection between the second terminal and the via conductor is required.

SUMMARY

The present invention was made in view of the above circumstances, and is directed to providing an electronic component embedded substrate capable of improving reliability of electrical connection between second terminals and via conductors.

An electronic component embedded substrate according to an embodiment of the present invention includes: a substrate configured to include an insulating layer and to have a first principal surface and a second principal surface on the opposite side of the first principal surface; an electronic component embedded in the substrate and configured to have at least one first terminal provided close to the first principal surface, at least one second terminal provided close to the second principal surface, and a capacity part provided between the first terminal and the second terminal; at least one via conductor formed in the insulating layer and electrically connected to the second terminal; and an adhesion layer in contact with the second terminal on an end face of the second terminal which are close to the second principal surface. The electronic component is laminated with the insulating layer, and adhesion strength between the adhesion layer and the insulating layer is higher than that between the second terminal and the insulating layer.

The electronic component embedded substrate includes the adhesion layer in contact with the second terminal on the end face of the second terminal which is close to the second principal surface, and the adhesion strength between the adhesion layer and the insulating layer is higher than that between the second terminal and the insulating layer. When the adhesion layer is provided in this way, adherability between the second terminal and the insulating layer is improved, and it is possible to inhibit adhesion between the second terminal and the insulating layer from being broken by internal stress and an external force in the electronic component embedded substrate. Accordingly, the stress is inhibited from being concentrated on the via conductor, and reliability of electrical connection between the second terminal and the via conductor can be improved.

In an embodiment, a material having a largest area on the end face among materials of which the second terminal is formed and a material of which the via conductor is formed may be different from each other. In such cases, a material of which the insulating layer is formed is commonly selected with preference for adherability to the material of which the via conductors abutting against the insulating layer are formed. As a result, in comparison with a case in which the second terminal and the via conductor are both formed of the same material, the adhesion strength between the second terminal and the insulating layer tends to be insufficient, and the adhesion between the second terminal and the insulating layer may be broken. In contrast, when the adhesion layer is provided, it is possible to more effectively inhibit the breakage of the adhesion between the second terminal and the insulating layer.

In an embodiment, the adhesion layer and the via conductor may be in contact with each other, and adhesion strength between the adhesion layer and the via conductor may be higher than that between the second terminal and the via conductor. In this case, in addition to a portion at which the second terminal and the via conductor are in contact with each other, a portion at which the adhesion layer and the via conductor are in contact with each other are formed. Further, since the adhesion strength between the adhesion layer and the via conductor is higher than that between the second terminal and the via conductor, the via conductor is more firmly fixed. Accordingly, the reliability of the electrical connection between the second terminal and the via conductor can be further improved.

In an embodiment, the adhesion layer may have a plurality of layers. In this case, since the adhesion layer can be formed of a plurality of materials, the adhesion strength between the adhesion layer and the second terminal and the adhesion strength between the adhesion layer and the insulating layer are both increased. Accordingly, the adherability between the second terminal and the insulating layer is further improved, so that it is possible to more reliably inhibit the adhesion between the second terminal and the insulating layer from being broken by the internal stress and the external force in the electronic component embedded substrate. Accordingly, the reliability of the electrical connection between the second terminal and the via conductor can be further improved.

In an embodiment, the substrate may further include a core embedded in the insulating layer, a through-hole passing from the first principal surface side to the second principal surface side may be provided in the core, and the electronic component may be disposed in the through-hole. In this case, a strength of the entire electronic component embedded substrate can be improved.

According to the present invention, an electronic component embedded substrate capable of improving reliability of electrical connection between second terminals and via conductors is provided.

DETAILED DESCRIPTION

Hereinafter, various embodiments of the present invention will be described with reference to the drawings. In each of the drawings, identical or equivalent parts are given the same reference signs, and duplicate description thereof will be omitted.

Figure 1:
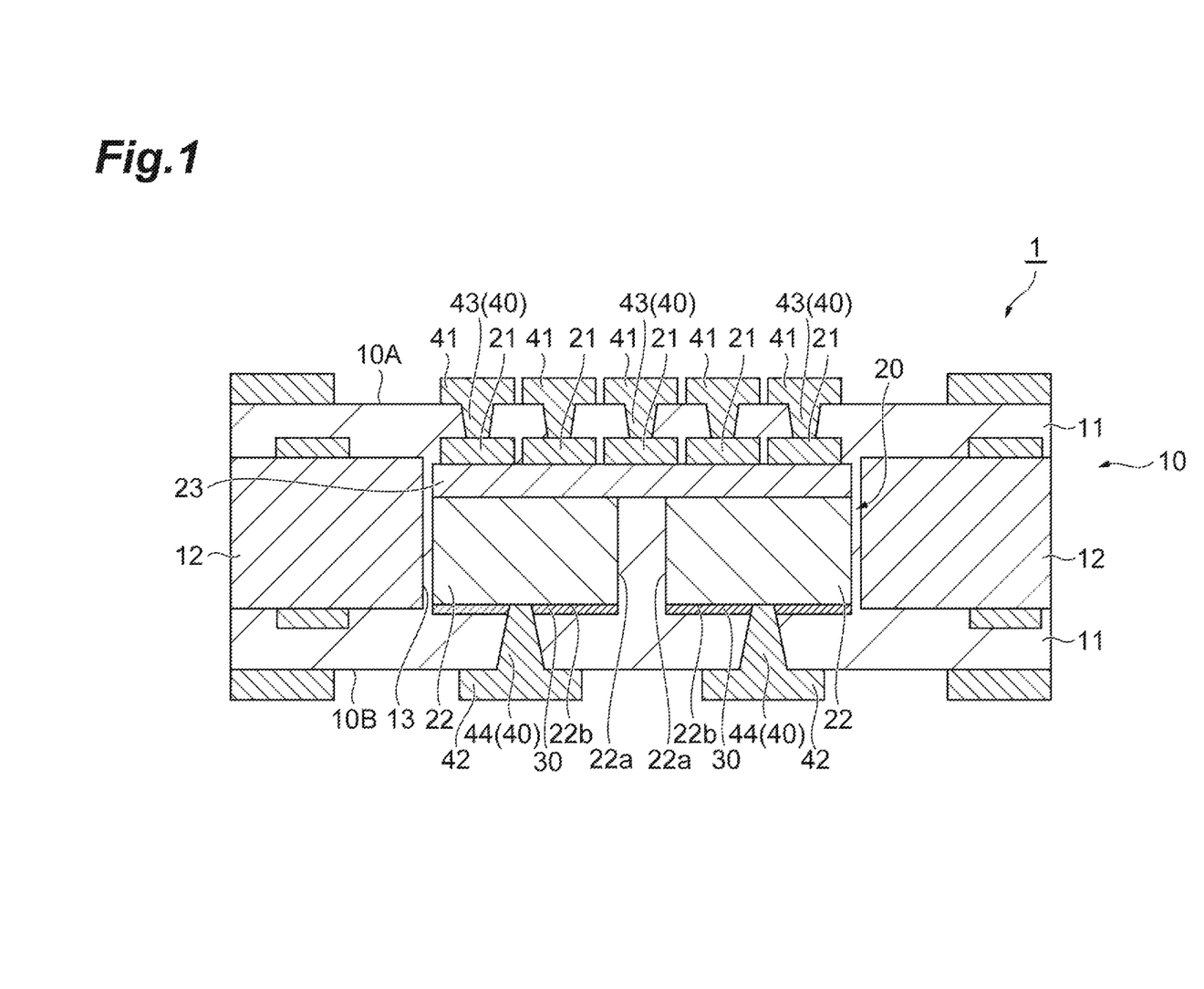
FIG. 1 is a sectional view schematically illustrating a part of an electronic component embedded substrate according to an embodiment of the present invention.

FIG. 1 is a sectional view schematically illustrating a part of an electronic component embedded substrate according to an embodiment of the present invention. An electronic component embedded substrate 1 illustrated in FIG. 1 is a substrate used in, for instance, a communication terminal or the like. As illustrated in FIG. 1, the electronic component embedded substrate 1 includes a substrate 10 having an insulating layer 11 and a core 12, an electronic component 20 embedded in the substrate 10, an adhesion layer 30, and via conductors 40 formed in the insulating layer 11. The substrate 10 has a first principal surface 10A and a second principal surface 10B on the opposite side of the first principal surface 10A. The electronic component 20 has a plurality of first terminals 21 that are provided close to the first principal surface 10A, a plurality of second terminals 22 that are provided close to the second principal surface 10B, and a capacity part 23 that is provided between the first terminals 21 and the second terminals 22. The adhesion layer 30 is provided close to the second principal surface 10B with respect to the second terminals 22 of the electronic component 20. The electronic component embedded substrate 1 includes first electrodes 41 that are electrically connected to the first terminals 21 of the electronic component 20, and second electrodes 42 that are electrically connected to the second terminals 22 of the electronic component 20. Here, when the electronic component 20 is said to be "embedded in" the substrate 10, it refers to a state in which the electronic component 20 is not exposed from the first and second principal surfaces 10A and 10B of the substrate 10.

The substrate 10 is a so-called multi-layered circuit substrate. In the present embodiment, the substrate 10 includes the insulating layer 11 and the core 12. The core 12 is embedded in the insulating layer 11. The first and second principal surfaces 10A and 10B of the substrate 10 are equivalent to principal surfaces of the insulating layer 11. A through-hole 13 passing from the first principal surface 10A side to the second principal surface 10B side is provided in the core 12. The electronic component 20 is disposed in the through-hole 13. The insulating layer 11 is filled in the through-hole 13, and the insulating layer 11 is interposed between the electronic component 20 and the core 12. The insulating layer 11 is formed of, for instance, an insulating material such as an epoxy resin, an acrylic resin, a phenolic resin, or the like. The insulating material of which the insulating layer 11 is formed is preferably a material whose hardness is changed by specific treatment, such as a thermosetting resin or a photocurable resin. The core 12 is formed of, for instance, a silicon (Si) substrate, a glass ($SiO_2$) substrate, a resin substrate, or the like. A whole thickness of the substrate 10 may be set to, for instance, about 40 μm to 1000 μm. A thickness of the insulating layer 11 may be set to, for instance, about 1 μm to 200 μm, and a thickness of the core 12 may be set to, for instance, about 20 μm to 400 μm. The whole thickness of the substrate 10, the thickness of the insulating layer 11, and the thickness of the core 12 are not particularly limited. The substrate 10 may be formed without the core 12.

The electronic component 20 is a capacitor having a plurality of first terminals 21, a plurality of second terminals 22, and a capacity part 23 provided between the plurality of first terminals 21 and the plurality of second terminals 22. In the present embodiment, a case in which the electronic component 20 is a so-called thin film capacitor (TFCP) in which the first terminals 21 and second terminals 22 are formed of a metal thin film and the capacity part 23 is formed of a dielectric film will be described.

The first terminals 21 are divided to be, for example, five terminals, and the second terminals 22 are divided to be, for example, two terminals. Each of the divided second terminals 22 has an end face 22a that faces the neighboring second terminal 22, and an end face 22b close to the second principal surface 10B. The insulating layer 11 is filled between the end faces 22a of the neighboring second terminals 22. The sum of thicknesses of the three layers (the first terminal 21, the second terminal 22, and the capacity part 23) of the electronic component 20 is, for instance, about 5 μm to 650 μm. The thickness of the first terminal 21 may be set to about 0.1 μm to 50 μm, the thickness of the capacity part 23 may be set to about 0.05 μm to 100 μm, and the thickness of the second terminals 22 may be set to about 5 μm to 500 μm.

As a material of which the first terminals 21 and the second terminals 22 are formed, a material whose principal component is nickel (Ni), copper (Cu), aluminum (Al), platinum (Pt), an alloy containing these metals, or an intermetallic compound is preferably used. However, the materials of the first and second terminals 21 and 22 are not particularly limited as long as they are conductive materials. In the present embodiment, a case in which copper is used as the principal component of the first terminals 21 and nickel is used as the principal component of the second terminals 22 will be described. "Principal component" means that a percentage of the component is higher than or equal to 50 mass %. As a mode for the first terminals 21 and the second terminals 22, in addition to a case in which these terminals are formed of an alloy or an intermetallic compound, a case in which these terminals have a laminate structure formed of two or more layers is also included. For example, an electrode layer may be formed as a double-layered structure in which a Cu thin film is provided on a Ni thin film. When pure nickel is used for the first terminals 21 and/or the second terminals 22, a purity of the nickel is preferably 99.99% or higher. Further, in the case of the alloy containing nickel, a metal contained as a metal other than nickel preferably includes at least one selected from the group consisting of platinum (Pt), palladium (Pd), iridium (Ir), rhodium (Rh), ruthenium (Ru), osmium (Os), rhenium (Re), tungsten (W), chromium (Cr), tantalum (Ta), silver (Ag), and copper (Cu).

When the second terminals 22 include two or more materials, the second terminals 22 may have a structure such as a so-called through silicon via (TSV) structure in which a through-hole is formed in silicon (Si) or glass ($SiO_2$) and a conductive material is embedded in the through-hole.

The capacity part 23 is formed of a perovskite-based dielectric material. Here, the perovskite-based dielectric material in the present embodiment includes a (strong) dielectric material having a perovskite structure such as $BaTiO_3$ (barium titanate), $(Ba_{1-x}Sr_x)TiO_3$ (barium strontium titanate), $(Ba_{1-x}Ca_x)TiO_3$, $PbTiO_3$, $Pb(Zr_xTi_{1-x})O_3$, or the like, a composite perovskite relaxer type ferroelectric material typified by $Pb(Mg_{1/3}Nb_{2/3})O_3$ or the like. Here, in the perovskite structure and the perovskite relaxer type dielectric material, a ratio between an A site and a B site is typically an integer ratio, but it may be intentionally shifted from an integer ratio in order to improve characteristics. For characteristic control of the capacity part 23, an additive acting as an accessory component may be appropriately contained in the capacity part 23.

The electronic component 20 is laminated with the insulating layer 11. When it is said herein that "the electronic component 20 is laminated with the insulating layer 11," it means that the electronic component 20 and the insulating layer 11 are arranged side by side when viewed in a thickness direction (a laminating direction) of the electronic component. A state in which the electronic component 20 is embedded in the insulating layer 11 is also assumed to be included in the statement that "the electronic component 20 is laminated with the insulating layer 11." In the present embodiment, the entire electronic component 20 is in a state in which it is embedded in the insulating layer 11, and the adhesion layer 30 is interposed between the second terminals 22 and the insulating layer 11. The electronic component 20 may be laminated with the insulating layer 11 in a state in which the second terminals 22 are partly embedded in the insulating layer 11, and may be laminated via the adhesion layer 30 such that the second terminals 22 and the insulating layer 11 are not in contact with each other. Here, "the state in which the second terminals 22 are partly embedded in the insulating layer 11" refers to a state in which the peripheries of the second terminals 22 are partly covered with the insulating layer 11.

The adhesion layer 30 is provided in contact with the second terminals 22 on the end faces 22b close to the second principal surface 10B with respect to the second terminals 22 of the electronic component 20. To be more specific, the adhesion layer 30 covers the end faces 22b of the two second terminals 22, and is provided to connect the second terminals 22 and the insulating layer 11. Adhesion strength between the adhesion layer 30 and the insulating layer 11 is greater than that between the second terminal 22 and the insulating layer 11. As a material of which the adhesion layer 30 is formed, for example a metal material such as copper (Cu), aluminum (Al), titanium (Ti), chromium (Cr), or the like and an insulating material such as glass ($SiO_2$), silicon nitride (SiN), or the like may be used. As an example, when nickel is used in the second terminals 22 of the electronic component 20 and an epoxy resin is used in the insulating layer 11, the adhesion layer 30 can be formed using copper. The adhesion strength between the adhesion layer 30 and the insulating layer 11 can be set to, for instance, about 0.075 $N/m^2$ to 0.375 $N/m^2$. The adhesion strength can be measured by a peel method. A thickness of the adhesion layer 30 can be set to, for instance, about 0.1 µm to 50 µm.

The first electrodes 41 are provided to correspond to the plurality of first terminals 21. In the present embodiment, an example in which five first electrodes 41 are provided is given. The first electrodes 41 are laminated with the first principal surface 10A of the substrate 10, and are electrically connected to the first terminals 21 by way of the via conductors 40 (first via conductors 43 (to be described below)). The first terminals 21 of the electronic component 20 are configured to enable electrical connection with an external electronic component or a wiring via the first via conductors 43 and the first electrodes 41. The first electrodes 41 are formed of a conductive material such as, for instance, copper (Cu).

The second electrodes 42 are provided to correspond to the plurality of second terminals 22. In the present embodiment, an example in which two second electrodes 42 are provided is given. The second electrodes 42 are laminated with the second principal surface 10B of the substrate 10, and are electrically connected to the second terminals 22 by way of the via conductors 40 (second via conductors 44 (to be described below)). The second terminals 22 of the electronic component 20 are configured to enable electrical connection with an external electronic component or a wiring via the second via conductors 44 and the second electrodes 42. The second electrodes 42 are formed of a conductive material such as, for instance, copper (Cu).

The via conductors 40 include the first via conductors 43 that electrically connect the first terminals 21 and the first electrodes 41, and the second via conductors 44 that electrically connect the second terminals 22 and the second electrodes 42. The first via conductors 43 pass through the insulating layer 11 between the first terminals 21 and the first electrodes 41. The second via conductors 44 pass through the insulating layer 11 and the adhesion layer 30 between the second terminals 22 and the second electrodes 42, and the adhesion layer 30 and the second via conductors 44 are in contact with each other. The first via conductors 43 and the second via conductors 44 are formed of a conductive material such as, for instance, copper (Cu). The second via conductors 44 are formed of a material that is different from a material having the largest area on the end faces 22b among the materials of which the second terminals 22 are formed. As an example, when nickel is used in the second terminals 22 of the electronic component 20, an epoxy resin is used in the insulating layer 11, and copper is used in the adhesion layer 30, the second via conductors 44 can be formed using copper. In this way, both the second via conductors 44 and the adhesion layer 30 may be formed of the same material. Both the second terminals 22 and the second via conductors 44 may be formed of the same material.

Next, a method for manufacturing the electronic component embedded substrate 1 according to the present embodiment will be described with reference to FIGS. 2 to 4B. FIGS. 2 to 4B are views for describing a method for manufacturing the electronic component embedded substrate illustrated in FIG. 1. In FIGS. 2 to 4B, a method for manufacturing one electronic component embedded substrate 1 is illustrated. However, in practice, after a plurality of electronic component embedded substrates 1 are formed on a single support substrate, the electronic component embedded substrates 1 are individually segmented. Accordingly, FIGS. 2 to 4B are enlarged views illustrating a part on the single support substrate.

Figure 2:
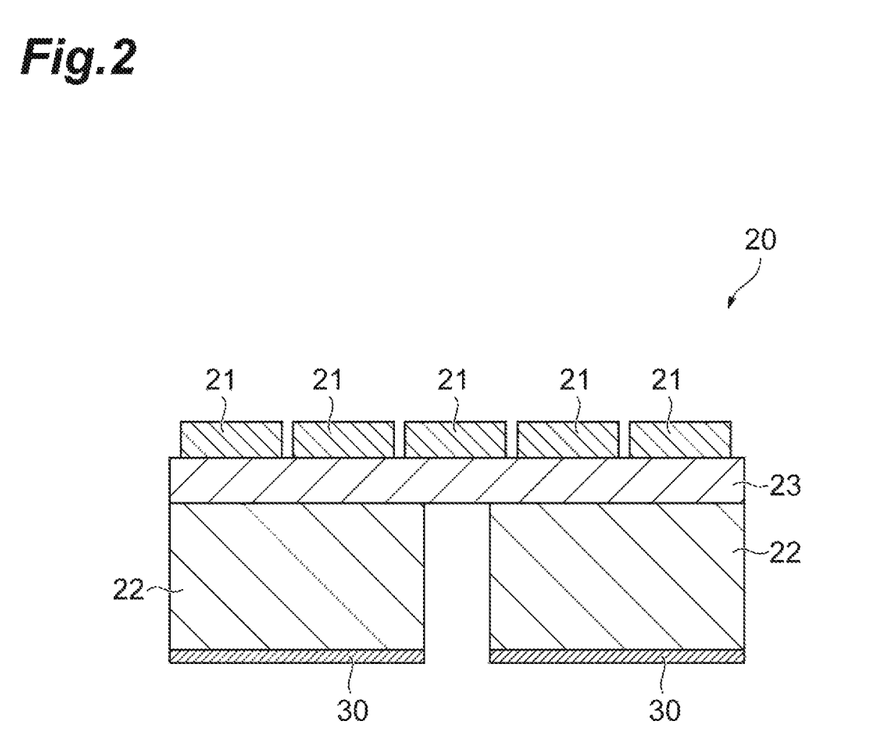
FIG. 2 is a view for describing a method for manufacturing the electronic component embedded substrate illustrated in FIG. 1.

First, as illustrated in FIG. 2, the electronic component 20 is prepared, and the adhesion layer 30 is formed on the end faces 22b of the second terminals 22. The first terminals 21 of the electronic component 20 are divided to be five terminals, and the second terminals 22 are divided to be two terminals. The adhesion layer 30 may be formed using a known film forming process such as, for instance, sputtering. Thereby, each of the end faces 22b of the two second terminals 22 is in a state in which it is covered with the adhesion layer 30.

Figure 3A:
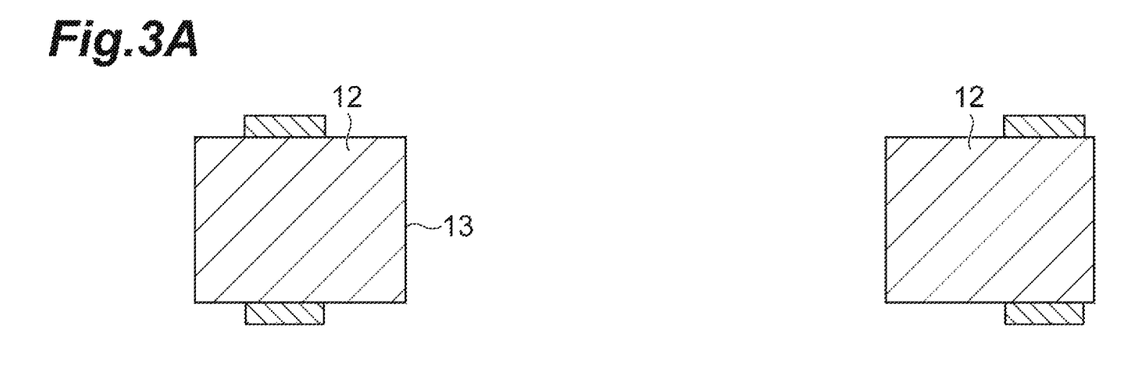
FIG. 3A is a view for describing the method for manufacturing the electronic component embedded substrate illustrated in FIG. 1.
Figure 3B:
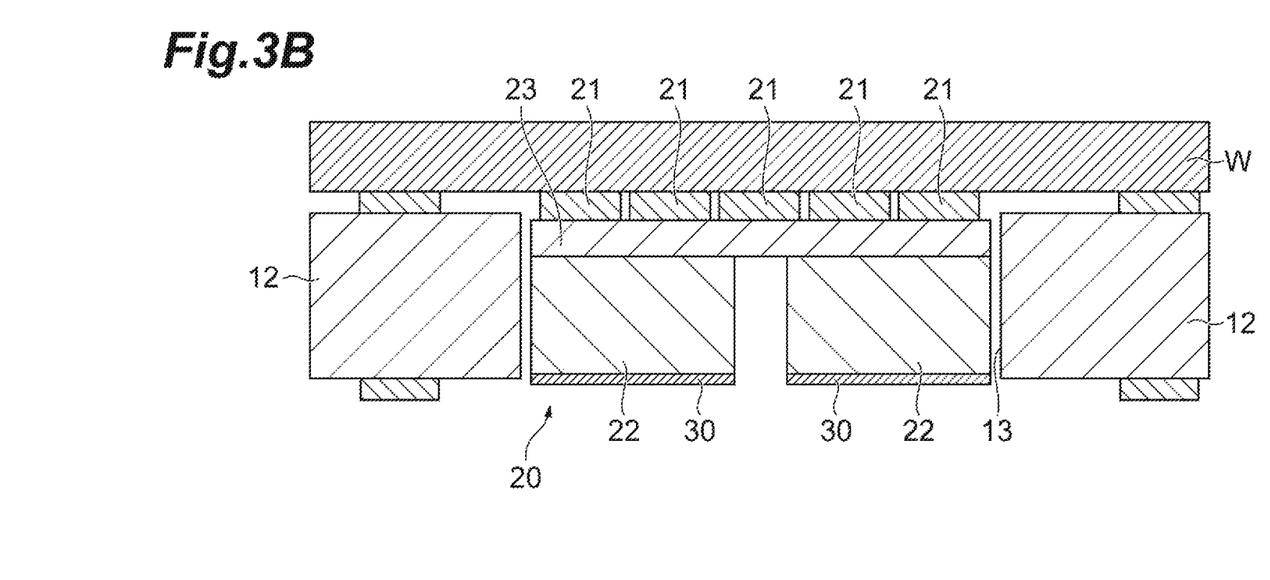
FIG. 3B is a view for describing the method for manufacturing the electronic component embedded substrate illustrated in FIG. 1.

Next, as illustrated in FIG. 3A, the core 12 in which the through-hole 13 is provided is prepared. The through-hole 13 may be formed using a known process such as, for instance, etching. Afterwards, as illustrated in FIG. 3B, a support substrate W is prepared, and the core 12 is temporarily fixed to the support substrate W. Further, the electronic component 20 is disposed and temporarily fixed in the through-hole 13 of the core 12. As the support substrate W, for example a mounting temporary fixture or the like having stickiness may be used.

Figure 4A:
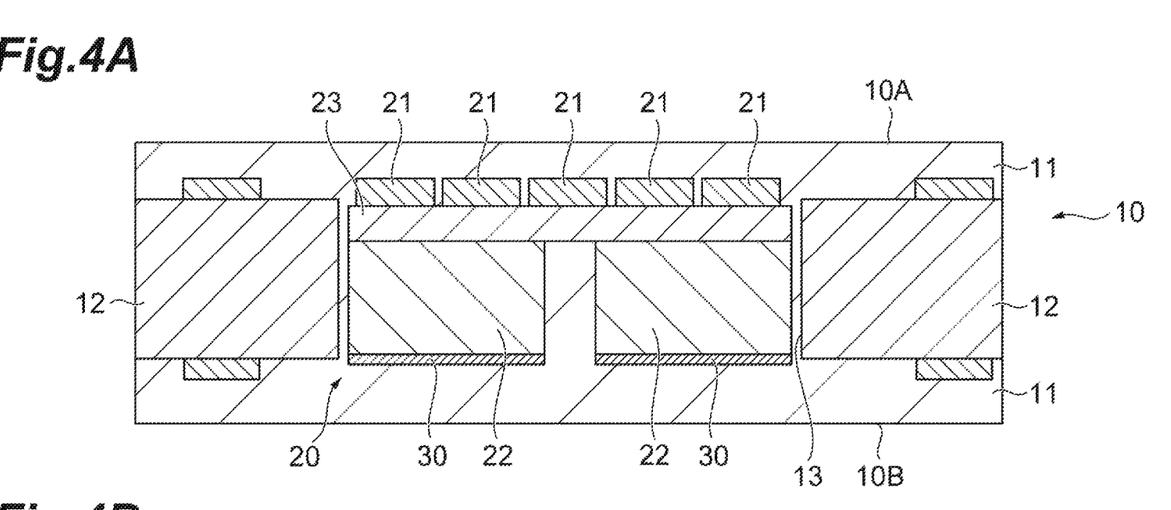
FIG. 4A is a view for describing the method for manufacturing the electronic component embedded substrate illustrated in FIG. 1.

Next, as illustrated in FIG. 4A, the insulating layer 11 is formed. The insulating layer 11 is formed, for example, by applying a resin material in an uncured state to the core 12 and the electronic component 20 that are temporarily fixed to the support substrate W, and removing the support substrate W after the resin material is cured. Thereby, the core 12 and the electronic component 20 are in a state in which they are embedded in the insulating layer 11.

Figure 4B:
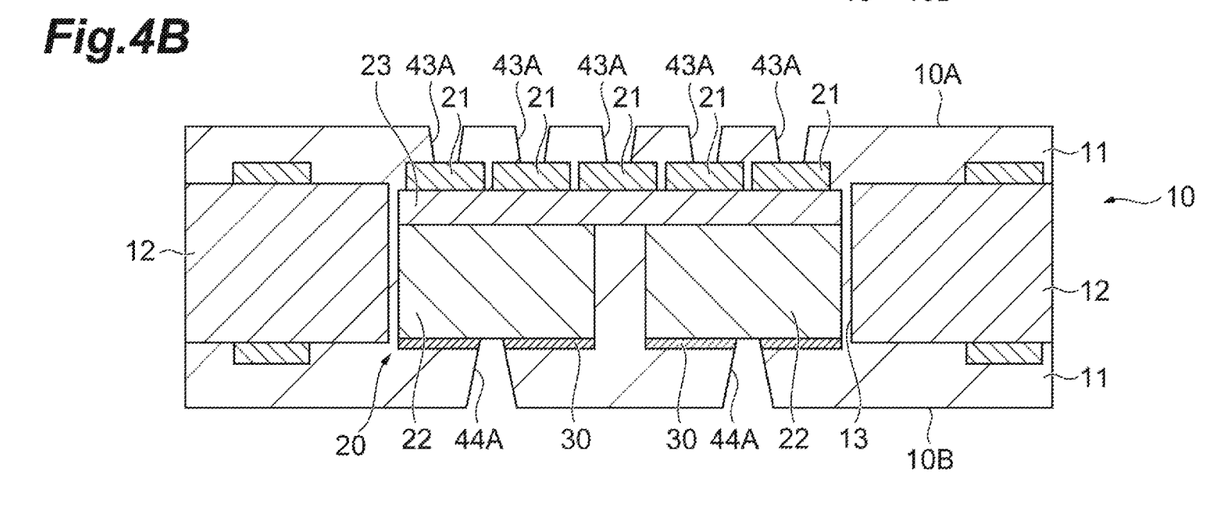
FIG. 4B is a view for describing the method for manufacturing the electronic component embedded substrate illustrated in FIG. 1.

Next, as illustrated in FIG. 4B, holes 43A for forming the first via conductors 43 and holes 44A for forming the second via conductors 44 are formed. The holes 43A are formed in places corresponding to the first terminals 21 respectively, and pass through the insulating layer 11 between the first principal surface 10A and the first terminals 21. The holes 44A are formed in places corresponding to the second terminals 22 respectively, and pass through the insulating layer 11 and the adhesion layer 30 between the second principal surface 10B and the second terminals 22. The holes 43A and 44A may be formed by, for instance, laser ablation.

Next, the first via conductors 43 are formed in the holes 43A by plating or sputtering, and the second via conductors 44 are formed in the holes 44A by plating or sputtering. Thereafter, patterning is performed on metal layers formed on the first principal surface 10A and the second principal surface 10B. Thereby, the plurality of first electrodes 41 and the plurality of second electrodes 42 are formed. Finally, individual segmentation is performed by dicing or the like, and thereby the electronic component embedded substrate 1 illustrated in FIG. 1 is obtained.

As described above, the electronic component embedded substrate 1 includes the adhesion layer 30 that is in contact with the second terminals 22 on the end faces 22b close to the second principal surface 10B with respect to the second terminals 22. The adhesion strength between the adhesion layer 30 and the insulating layer 11 is greater than that between the second terminal 22 and the insulating layer 11. When the adhesion layer 30 is not provided, the adhesion strength between the second terminal 22 and the insulating layer 11 becomes insufficient, and adhesion between the second terminal 22 and the insulating layer 11 may be broken by internal stress and an external force in the electronic component embedded substrate 1. In this case, the stress is concentrated on the second via conductors 44, and a connection structure for the second terminals 22 and the second via conductors 44 may be damaged. In contrast, when the adhesion layer 30 is provided as in the present embodiment, adherability between the second terminal 22 and the insulating layer 11 can be improved. Thereby, in comparison with the case in which the adhesion layer 30 is not provided, it is possible to inhibit the adhesion between the second terminal 22 and the insulating layer 11 from being broken by the internal stress and the external force in the electronic component embedded substrate 1. As a result, the stress is inhibited from being concentrated on the second via conductors 44, and reliability of the electrical connection between the second terminals 22 and the second via conductors 44 can be improved.

The material having the largest area on the end faces 22b among the materials of which the second terminals 22 are formed is different from that of which the second via conductors 44 are formed. In such cases, the material of which the insulating layer 11 is formed is commonly selected with preference for adherability to the material of which the second via conductors 44 abutting against the insulating layer 11 are formed. As a result, in comparison with the case in which both the second terminals 22 and the second via conductors 44 are formed of the same material, the adhesion strength between the second terminal 22 and the insulating layer 11 tends to be insufficient. For this reason, the adhesion between the second terminal 22 and the insulating layer 11 may be broken by the internal stress and the external force in the electronic component embedded substrate 1. In contrast, when the adhesion layer 30 is provided, it is possible to more effectively inhibit the breakage of the adhesion between the second terminal 22 and the insulating layer 11.

The second via conductors 44 pass through the adhesion layer 30, the adhesion layer 30 and the second via conductors 44 are in contact with each other, and the adhesion strength between the adhesion layer 30 and the second via conductor 44 is higher than that between the second terminal 22 and the second via conductor 44. Thereby, in addition to portions at which the second terminals 22 and the second via conductors 44 are in contact with each other, portions at which the adhesion layer 30 and the second via conductors 44 are in contact with each other are formed. Further, since the adhesion strength between the adhesion layer 30 and the second via conductor 44 is higher than that between the second terminal 22 and the second via conductor 44, the second via conductors 44 are more firmly fixed. Accordingly, the reliability of the electrical connection between the second terminals 22 and the second via conductors 44 can be further improved. When both the adhesion layer 30 and the second via conductors 44 are formed of the same material, the reliability of the electrical connection between the second terminals 22 and the second via conductors 44 can be more effectively improved.

In the electronic component embedded substrate 1, the substrate 10 further includes the core 12 embedded in the insulating layer 11, the through-hole 13 passing from the first principal surface 10A side to the second principal surface 10B side is provided in the core 12, and the electronic component 20 is disposed in the through-hole 13. Thereby, in comparison with a case in which the substrate 10 does not have the core 12, strength of the substrate 10 can be increased by the core 12. Accordingly, strength of the entire electronic component embedded substrate 1 can be improved.

While an embodiment of the present invention has been described, the present invention is not limited to the above embodiment, and can be variously modified.

Figure 5:
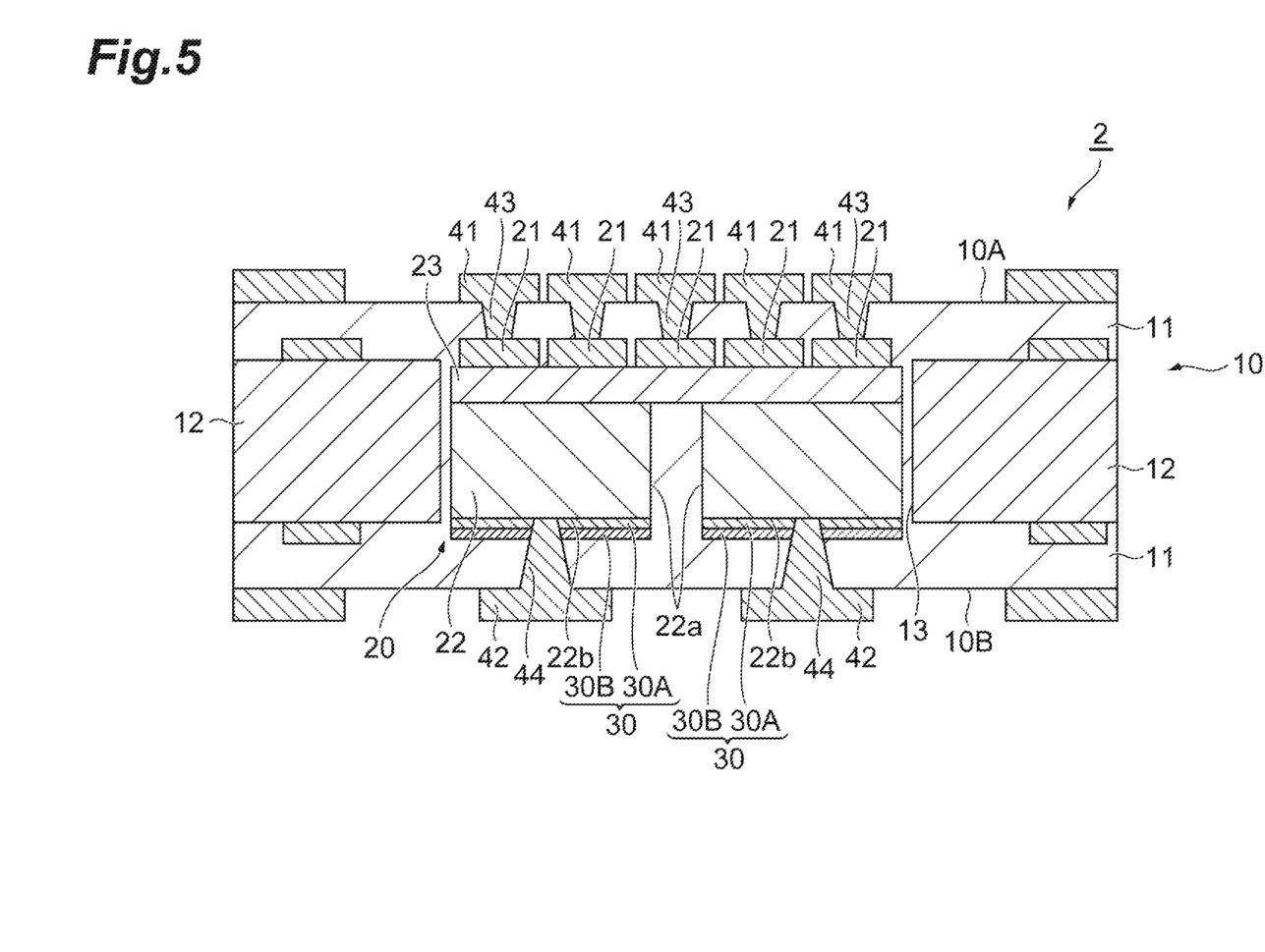
FIG. 5 is a sectional view schematically illustrating a part of an electronic component embedded substrate according to a modification.

In the above embodiment, the adhesion layer 30 is formed of a single layer, but the adhesion layer 30 may have a plurality of layers. FIG. 5 is a sectional view schematically illustrating a part of an electronic component embedded substrate according to a modification. In the electronic component embedded substrate 2 illustrated in FIG. 5, an adhesion layer 30 is formed of two layers, one of which is a first adhesion layer 30A that is in contact with second terminals 22, and the other of which is a second adhesion layer 30B that is provided close to a second principal surface 10B with respect to the first adhesion layer 30A. When the adhesion layer 30 is formed in a multilayered structure in this way, the first adhesion layer 30A can be formed of a material having excellent adherability to the second terminals 22, and the second adhesion layer 30B can be formed of a material having excellent adherability to the insulating layer 11. That is, the adhesion layer 30 can be formed of a plurality of materials.

Accordingly, adhesion strength between the adhesion layer 30 (the first adhesion layer 30A) and the second terminal 22 and adhesion strength between the adhesion layer 30 (the second adhesion layer 30B) and the insulating layer 11 can both be increased. As a result, it is possible to further improve adherability between the second terminal 22 and the insulating layer 11 and to reliably inhibit adhesion between the second terminal 22 and the insulating layer 11 from being broken by internal stress and an external force in the electronic component embedded substrate 2. Hence, reliability of electrical connection between the second terminals 22 and second via conductors 44 can be further improved. As an example of a combination of materials of which the first adhesion layer 30A and the second adhesion layer 30B are formed, when nickel is used in the second terminals 22 and an epoxy resin is used in the insulating layer 11, the first adhesion layer 30A can be formed of chromium (Cr), and the second adhesion layer 30B can be formed of copper (Cu). The number of layers constituting the adhesion layer 30 is not particularly limited, and the adhesion layer 30 may have a multilayered structure having three or more layers. A thickness of each of the layers constituting the adhesion layer 30 is not particularly limited, and can be arbitrarily set.

Figure 6:
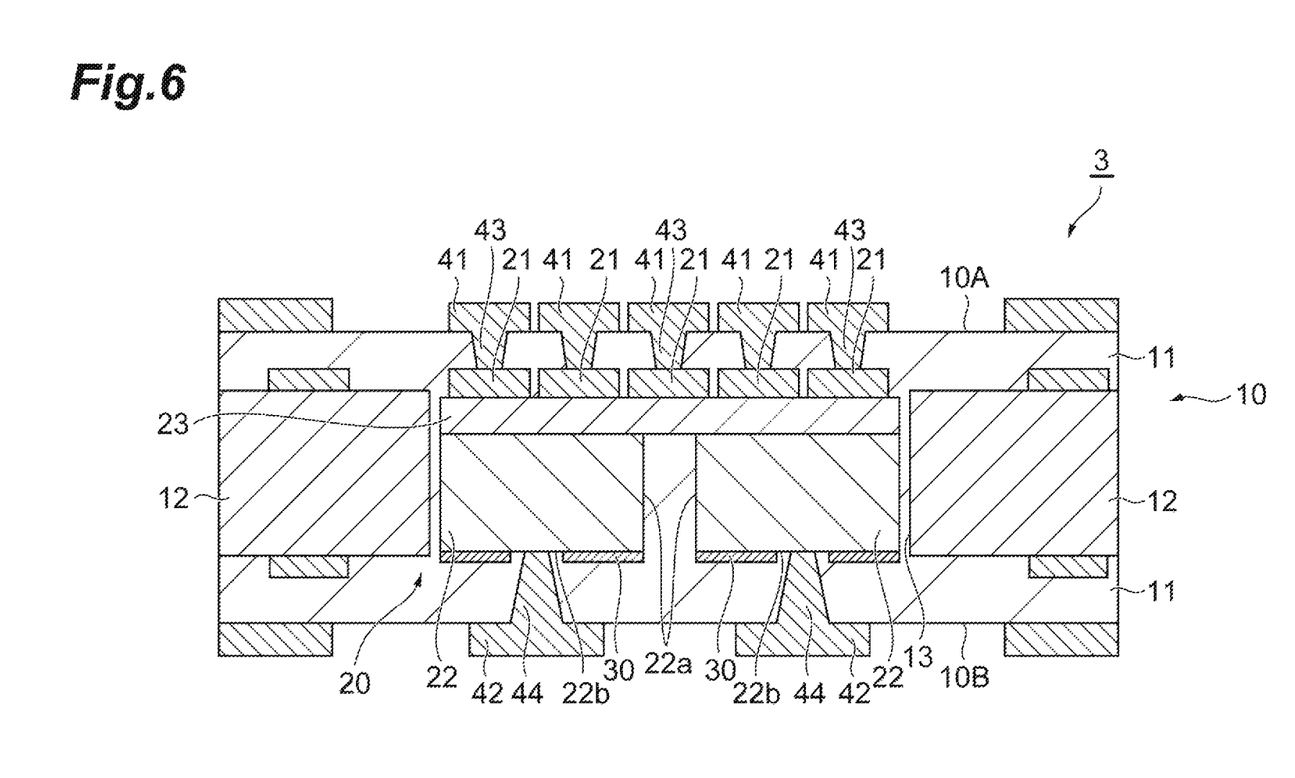
FIG. 6 is a sectional view schematically illustrating a part of an electronic component embedded substrate according to another modification.

In the above embodiment, the adhesion layer 30 and the second via conductors 44 are in contact with each other, but the adhesion layer 30 and the second via conductors 44 may not be in contact with each other. FIG. 6 is a sectional view schematically illustrating a part of an electronic component embedded substrate according to another modification. In the electronic component embedded substrate 3 illustrated in FIG. 6, second via conductors 44 and an adhesion layer 30 are not in contact with each other, and an insulating layer 11 is interposed between the second via conductors 44 and the adhesion layer 30. In this case as well, since adherability between a second terminal 22 and the insulating layer 11 can be improved, it is possible to inhibit adhesion between the second terminal 22 and the insulating layer 11 from being broken by internal stress and an external force in the electronic component embedded substrate 3. Accordingly, it is possible to inhibit stress from being concentrated on second via conductors 44 and to improve reliability of electrical connection between the second terminals 22 and the second via conductors 44.

In the above embodiment, the second via conductors 44 pass through the adhesion layer 30 to be in contact with the second terminals 22. However, when the adhesion layer 30 is formed of a conductive material, the second via conductors 44 may not be in contact with the second terminals 22. In this case, the second terminals 22 and the second via conductors 44 are electrically connected via the adhesion layer 30. In this configuration as well, by forming the adhesion layer 30 of a material having excellent adherability to the second via conductors 44, the reliability of the electrical connection between the second terminals 22 and the second via conductors 44 can be improved.

In the above embodiment, the adhesion layer 30 is provided only on the end faces 22b of the second terminals 22. However, in addition to the end faces 22b of the second terminals 22, the adhesion layer 30 may also be provided on the end faces 22a. Further, the adhesion layer 30 may also be provided on the end faces of the second terminals 22 which face the core 12. In this case, the adherability between the second terminals 22 and the insulating layer 11 can be further improved.

A sintering treatment may be performed on the second terminals 22. Thereby, in comparison with a case in which the sintering treatment is not performed, surface roughnesses of the end faces 22a and 22b of the second terminals 22 can be increased. Therefore, due to an anchor effect, the adherability between the second terminals 22 and the adhesion layer 30 and the adherability between the second terminals 22 and the insulating layer 11 can be improved.

In the above embodiment, with regard to the electronic component 20 in the electronic component embedded substrate, the example in which the first terminals 21 are divided to be five terminals and the second terminals 22 are divided to be two terminals has been described. However, a number and shape of the terminals are not limited to the above embodiment, and can be appropriately modified. When the second terminals 22 are divided to be two or more terminals, the adhesion layer 30 may be provided for all the second terminals 22, or the adhesion layer 30 may be provided for only some of the second terminals 22. Even when the adhesion layer 30 is provided for only some of the second terminals 22, the adherability between the second terminals 22 and the insulating layer 11 can be improved, and the reliability of the electrical connection between the second terminals 22 and the second via conductors 44 can be improved. The first terminals 21 and the second terminals 22 may not be divided to be a plurality of terminals.

What is claimed is:

1. An electronic component embedded substrate comprising:
   a substrate having:
      an insulating layer;
      a first principal surface; and
      a second principal surface on an opposite side of the first principal surface;
   an electronic component embedded in the substrate and laminated with the insulating layer, the electronic component having:
      a plurality of first terminals that are divided from each other and disposed closer to the first principal surface than to the second principal surface;
      a plurality of second terminals that are divided from each other and disposed closer to the second principal surface than to the first principal surface, the plurality of second terminals being made of a first material and each including an end face facing the second principal surface; and
      a capacity part provided between the plurality of first terminals and the plurality of second terminals;
   via conductors formed in the insulating layer and respectively electrically connected to each of the plurality of second terminals, the via conductors being formed of a second material different from the first material; and
   adhesion layers respectively in contact with the end faces of each of the plurality of second terminals, wherein adhesion strength between the adhesion layers and the insulating layer is higher than that between the plurality of second terminals and the insulating layer,
a number of the first terminals is larger than a number of the second terminals, and
the second terminals are thicker than the first terminals in a laminating direction;
the adhesion layers and the via conductors are in contact with each other; and
adhesion strength between the adhesion layers and the via conductors is higher than that between the second terminals and the via conductors.

2. The electronic component embedded substrate according to claim 1, wherein the adhesion layers each have a plurality of layers.

3. The electronic component embedded substrate according to claim 1, wherein:
the substrate further includes a core embedded in the insulating layer;
a through-hole passing from a first principal surface side to a second principal surface side is provided in the core; and
the electronic component is disposed in the through-hole.

4. The electronic component embedded substrate according to claim 2, wherein:
the substrate further includes a core embedded in the insulating layer;
a through-hole passing from a first principal surface side to a second principal surface side is provided in the core; and
the electronic component is disposed in the through-hole.

* * * * *